United States Patent [19]

Colyer et al.

[11] Patent Number: 4,962,010

[45] Date of Patent: Oct. 9, 1990

[54] METHOD FOR PRODUCING AMINO-FORMALDEHYDE MICROCAPSULES AND PHOTOSENSITIVE MICROCAPSULES PRODUCED THEREBY

[75] Inventors: E. Keith Colyer, Kettering; Joseph G. O'Connor, Springboro; W. A. Hammann, IV, Centerville, all of Ohio

[73] Assignee: The Mead Corporation, Dayton, Ohio

[21] Appl. No.: 370,103

[22] Filed: Jun. 22, 1989

Related U.S. Application Data

[63] Continuation of Ser. No. 128,292, Dec. 3, 1987, abandoned.

[51] Int. Cl.$^5$ ............................ G03C 1/68; B01J 13/02
[52] U.S. Cl. ........................................ 430/138; 430/56; 430/58; 430/90; 430/281; 428/402.21; 428/402.24; 264/4.7
[58] Field of Search ................ 430/138, 56, 58, 90, 430/281; 428/402.21, 402.24; 264/4.7

[56] References Cited

U.S. PATENT DOCUMENTS

| | | | |
|---|---|---|---|
| 3,796,669 | 3/1974 | Kiritani et al. | 252/384 |
| 4,001,140 | 1/1977 | Foris et al. | 427/152 |
| 4,087,376 | 5/1978 | Foris et al. | 427/152 |
| 4,089,802 | 5/1978 | Foris et al. | 427/152 |
| 4,228,031 | 10/1980 | Iwasaki et al. | 428/914 |
| 4,353,809 | 10/1982 | Hoshi et al. | 503/215 |
| 4,399,209 | 8/1983 | Sanders et al. | 430/138 |
| 4,440,846 | 4/1984 | Sanders et al. | 430/138 |
| 4,486,762 | 12/1984 | Okamoto et al. | 430/326 |
| 4,500,624 | 2/1985 | Aono et al. | 430/203 |
| 4,563,212 | 1/1986 | Becher et al. | 71/DIG. 1 |
| 4,608,330 | 8/1986 | Marabella | 430/138 |
| 4,842,978 | 6/1989 | Ishikawa | 430/138 |

*Primary Examiner*—Paul R. Michl
*Assistant Examiner*—Patrick A. Doody
*Attorney, Agent, or Firm*—Thompson, Hine and Flory

[57] ABSTRACT

A method for forming microcapsules by enwrapping an oily core material in a formaldehyde condensation product formed in situ wherein methylated polygalacturonic acid is used in combination with a sulfonated polystyrene as an emulsion stabilizer; the method is particularly useful in forming photosensitive microcapsules in that uniform small microcapsules size is obtained.

15 Claims, No Drawings

METHOD FOR PRODUCING AMINO-FORMALDEHYDE MICROCAPSULES AND PHOTOSENSITIVE MICROCAPSULES PRODUCED THEREBY

This is a continuation of co-pending application Ser. No. 128,292, filed Dec. 3, 1987, now abandoned.

BACKGROUND OF THE INVENTION

The present invention relates to an improved method for producing microcapsules and, more particularly, to an improved method for producing microcapsules in which the wall is formed from a formaldehyde condensation product. While the method of the present invention is useful in producing microcapsules generally, microcapsules prepared in accordance with the present invention are particularly useful in photosensitive imaging materials of the type which employ a layer of microcapsules containing a radiation sensitive composition.

Imaging materials employing photosensitive microcapsules are the subject of commonly assigned U.S. Pat. Nos. 4,399,209 and 4,440,836.

In the aforesaid commonly assigned U.S. patents, images are formed by image-wise exposing a layer of photosensitive capsules to actinic radiation and rupturing the capsules typically by passing the imaging sheet containing the capsules through a pressure nip. The radiation sensitive composition contains a photohardenable or photosoftenable material which undergoes a change in viscosity upon exposure. For example, in the most typical embodiments, the radiation sensitive composition contains a polyethylenically unsaturated monomer which polymerizes upon exposure, thereby causing the phase internal to the capsules to become harder. Due to the difference in the hardness of the capsules in the exposed versus the unexposed areas, only certain capsules rupture and release their contents. If the internal phase contains a dye precursor, the precursor is image-wise released, and a color image is formed upon its transfer to a developer layer. In previously disclosed embodiments, the developer layer may be present on the same support as the layer of capsules or a separate support. It is advantageous if the developer is present on the same support since such a self-contained imaging sheet can be developed as an integral unit.

Previously, amine formaldehyde capsules having a desired uniform small size have been obtained by using pectin as a system modifier alone but preferably in combination with isobutylene-maleic anhydride copolymer. This method is the subject of commonly assigned U.S. Pat. No. 4,608,330.

SUMMARY OF THE INVENTION

In accordance with the present invention, microcapsules are prepared by emulsifying an oily material in an aqueous medium containing pectin or another methylated polygalacturonic acid and a sulfonated polystyrene. It has been found that when pectin and a sulfonated polystyrene are dissolved in the aqueous medium, and the capsule wall is formed in an otherwise conventional manner, microcapsules of a more uniform, controlled, small size are obtained. When these microcapsules are used in forming photosensitive imaging sheets as described in the aforementioned commonly assigned patents, the imaging sheets exhibit improved film speed and a more uniform photographic response.

Photosensitive microcapsules obtained in accordance with the present invention are characterized by an average particle size in the range of about 4 to 8 microns. At least 90% of the microcapsules have a particle size less than 10 microns. In accordance with one particular embodiment of the invention microcapsules having an average particle size of 5 microns and a size distribution of 2 to 10 microns are obtained. Because of their uniform small size these microcapsules are particularly useful in forming photosensitive imaging sheets.

Accordingly, one embodiment of the present invention is a process for producing microcapsules which comprises enwrapping particles of an oily core material dispersed in a continuous aqueous phase in polymeric shells produced by in situ condensation of formaldehyde and an amine or a precondensate thereof wherein the aqueous phase contains methylated polygalacturonic acid and a sulfonated polystyrene.

The principal example of the emulsion stabilizer used in the present invention is pectin, but other methylated polygalacturonic acids can also be used.

Another embodiment of the present invention resides in microcapsules having a discrete capsule wall and containing, in the internal phase, a radiation sensitive composition, said microcapsules being produced by enwrapping particles of an oil-in-water emulsion containing methylated polygalacturonic acid as an emulsion stabilizer and a sulfonated polystyrene in a polymer produced by in situ polymerization of formaldehyde and an amine, said microcapsules having an average particle size of about 4 to 8 microns, and not less than about 90% of said capsules being less than 10 microns in size.

Still another embodiment of the present invention is an imaging sheet. Self-contained imaging sheets in accordance with the present invention comprise a support, a layer of the aforesaid microcapsules, and a color developer layer preferably interposed between the layer of capsules and the support. Donor sheets generally consist of a layer of the microcapsules on a support. Donor sheets are exposed separately and then assembled with a sheet containing a dye developer on the surface for development.

The capsules may contain a photohardenable or a photosoftenable material, as the radiation sensitive material. In the most typical case, the capsules contain a polyethylenically unsaturated monomer, a photoinitiator, and a dye precursor. Imaging is conducted as described in the aforementioned commonly assigned patents and application which are incorporated herein by reference.

DETAILED DESCRIPTION OF THE INVENTION

The term "methylation degree" as used herein refers to the ratio of acid groups in the compound which are methylated to the total number of acid groups in the compound expressed as a percentage.

In accordance with the present invention, microcapsules are prepared from an aqueous based emulsion of the oily core material containing methylated polygalacturonic acid in the aqueous phase. Methylated polygalacturonic acids having a methylation degree greater than 50% are generally available. The preferred polygalacturonic acids have a methylation degree between 40 and 70% and still more preferably between 55 and 65%. However, acids having a methylation degree less than 40% or greater than 70% are also believed to be useful.

The most typical examples of useful acids are commonly known as pectins. Since pectin is a naturally occurring product, its composition will vary with the season and the source from which it is derived. As a result of this variation, some pectins will provide better microcapsules than others. Methylated polygalacturonic acid is generally added to the aqueous phase in an amount of about 1.0 to 8% based on the amount of water in the aqueous phase, with the preferred amount being about 2 to 4%.

Typical examples of sulfonated polystyrenes useful in the present invention are Versa TL500 and Versa TL502B, products of National Starch Co. Useful sulfonated polystyrenes are generally characterized by a sulfonation degree of over 85% and preferably over 95%. The molecular weight of the sulfonated polystyrene is preferably greater than 100,000 and more preferably about 500,000 but other molecular weights can also be used. The sulfonated polystyrene is usually added to the aqueous phase in an amount of about 1 to 6% by weight. The quality of this product has also been found to vary with the method by which it is manufactured such that certain sulfonated polystyrenes are better than others.

Emulsification is preferably conducted under conditions which afford an emulsion having an average particle size in the range of about 2.5 to 5.0 microns. The observed particle size of the emulsion is somewhat smaller than the particle size of the capsules produced. Typically, the emulsion is prepared by adding an oily material to be encapsulated to an aqueous phase containing methylated polygalacturonic acid and sulfonated polystyrene while stirring or otherwise agitating the aqueous phase to achieve the desired emulsion particle size. The aqueous phase may also include other capsule wall forming materials in a manner well known in the art.

The capsule wall can be formed around the radiation-sensitive oil droplets in the emulsion using many known wall forming techniques.

The present invention is particularly directed to forming microcapsules in which the oily core material is enwrapped in an amine-formaldehyde condensation product. Such microcapsules are formed by in situ condensation of formaldehyde and an amine such as urea, melamine, dimethylol urea, and the like or a pre-condensate thereof. The condensation product can be modified by the co-condensation of a polyhydric phenol such as resorcinol if desired.

Microcapsules can be prepared by forming an aqueous phase containing pectin and Versa TL, and adjusting the pH to suit the condensation reaction to be employed, followed by the addition of the oil phase. Generally, a pH of about 4.0 is useful in making urea-formaldehyde microcapsules whereas a pH of 6.0 is used in making melamine-formaldehyde capsules. To assist in dissolving the pectin, a small amount of sodium bicarbonate may be added to the pectin. This also acts as a buffer and improves ionic strength and thereby improves wall building characteristics. Upon dissolution carbon dioxide is generated and the bubbles help to break up the pectin.

Blending is continued until an average emulsion particle size of about 3.5 microns has been achieved whereupon solutions of the amine and formaldehyde or a solution of a precondensate thereof are/is added to the emulsion and the capsule walls gradually form.

Among many well known encapsulation techniques that can be used in the present invention are: Kiritani et al, U.S. Pat. No. 3,796,669 for urea-resorcinol-formaldehyde capsules; Forris et al, U.S. Pat. Nos. 4,001,140; 4,087,376 and 4,089,802 for melamine-formaldehyde capsules. The present invention can be practiced using the aforesaid techniques by incorporating pectin and sulfonated polystyrene prior to emulsification of the oil.

The process of the invention typically involves forming an agitating aqueous solution having the core material dispersed therein and, while maintaining the dispersion, adding solutions of the amine and formaldehyde or precondensates thereof. On reaction, any amineformaldehyde condensate separates from the solution which wets and enwraps the capsule core material. After the walls have been solidified, the capsules may be separated from the medium and washed.

One method in accordance with the present invention involves the following steps:
  (i) Preparing an aqueous solution of pectin and sulfonated polystyrene and adjusting pH
  (ii) Emulsifying the core material in the aqueous solution
  (iii) Adding amine and formaldehyde or amineformaldehyde precondensate to the system
  (iv) Adjusting pH
  (v) Polymerizing the amine and formaldehyde while stirring the system
  (vi) Heating
  (vii) Reacting the excess formaldehyde.

To prepare microcapsules having melamine-formaldehyde walls, the following procedure can be used:
  (i) Preparing an aqueous solution of pectin and sulfonated polystyrene and adjusting pH
  (ii) Emulsifying the core material in the aqueous solution
  (iii) Adding melamine-formaldehyde precondensate to the system
  (iv) Adjusting pH
  (v) Polymerizing pre-condensate
  (vi) Heating
  (vii) Reacting excess formaldehyde.

Another process involves the following sequence of steps:
  (i) Emulsifying an oil in an aqueous acid solution containing pectin and sulfonated polystyrene
  (ii) Adding an aqueous solution of urea
  (iii) Adding an aqueous solution of resorcinol
  (iv) Adding an aqueous solution of formaldehyde
  (v) Heating to 65° C.
  (vi) Adjusting the pH to 9.0
  (vii) Adding a solution of sodium acid sulfite to scavenge excess formaldehyde
  (viii) Removing an aqueous dispersion of the microcapsules.

The condensation reaction proceeds under acid conditions, e.g., pH of 7 or less; however, the reaction is preferably carried out at a pH in the range of 2.5 to 5.0. The temperature of the encapsulation medium should be maintained at about 10° to 95° C., preferably about 25° to 85° C. and more preferably about 45° to 75° C.

Among the acid catalysts that may be used are low molecular weight carboxylic acids, e.g., formic acid, acetic acid, etc.; inorganic acids, e.g., sulfuric acid, hydrochloric acid, phosphoric acid, etc.; and acidic or easily hydrolyzable salts such as aluminum sulfate, ammonium nitrate, ammonium chloride, ammonium sulfate, etc. Ammonium salts are preferred as they seem to provide a stronger and less permeable capsule. The ammonium salts are usually employed in an amount of about 2 to 20% by weight based on the amount of urea.

The amine and formaldehyde are preferably present in the encapsulation medium, whether as the free monomer or a precondensate, in a molar ratio of formaldehyde to amine of at least 1.5 and preferably about 2.0 to 3.0.

To reduce malodor and the incidence of skin irritation, when the polymerization reaction is complete, it is desirable to remove or react the excess formaldehyde. This can be accomplished by using any one of several known techniques such as the addition of phosphoric acid, urea, sulfite or bisulfite. These materials react with the formaldehyde to form a product which is easily removed from the medium. The addition of the urea or sodium sulfite to scavenge formaldehyde is preferably made in a single step after encapsulation and prior to storage. The pH and temperature of the medium should be adjusted for this reaction. The sulfite is preferably reacted at a pH of 6 to 8 at room temperature for about 2 hours. The urea can be reacted at a pH of 3 to 5 or 8 to 12 at a temperature of 30 to 60° C. for 4 hours.

Suitable polyhydric phenols that may be added to the reaction system for co-condensation with the amine and formaldehyde to improve impermeability are resorcinol, catechol, gallic acid, and the like. The phenols may be added in an amount of about 5 to 30% by weight based on the amount of urea.

In most cases it is desirable to add a polyisocyanate to the core material. This practice is described in detail in U.S. Pat. No. 4,353,809. The polyisocyanate is believed to react with water at the interface of the core material and the aqueous medium and form a thin layer of polymer which further stabilizes the emulsion. Preferred polyisocyanates are SF-50, an aromatic trisocyanate manufactured by Union Carbide, and Desmodur and N-100, a biuret of hexamethylene diisocyanate and water available from Mobay Chemical Co. The isocyanate is typically added in an amount of about 0.005 to 3 parts per 100 parts of the core material and preferably 0.01 to 2 parts.

The process of the present invention is advantageously used to produce microcapsules for use in photographic or pressure-sensitive recording papers. In the former embodiment, the core material is typically a substantially colorless color former dissolved in an oil. In the latter embodiment, the core material is typically a photosensitive composition containing a color former.

The radiation-sensitive compositions used in the present invention undergo a change in viscosity upon exposure to actinic radiation. "Actinic radiation" includes the entire electromagnetic spectrum (e.g., U.V., I.R., Visible), x-ray and ion beam radiation. These compositions may be positive working or negative working. For example, where the radiation sensitive composition contains a photohardenable material, such as, a photopolymerizable or photocrosslinkable material, in the exposed areas the internal phase solidifies or increases in viscosity and thereby prevents the capsules from rupturing and releasing the image forming agent (e.g., a color precursor) associated with the capsules. In the unexposed areas, the internal phase remains liquid, the capsules rupture, and the image-forming agents are mobilized. In this manner positive images are formed. On the other hand, where the capsules contain a photosoftenable material, such as a photodepolymerizable material, exposure reduces the viscosity of the internal phase and the elements active in the image-forming process are released in the exposed areas whereby negative images are formed.

Typical positive-working radiation sensitive compositions include a photoinitiator and a monomer, dimer, or oligomer which is polymerized to a higher molecular weight compound, or a polymer which is cross-linked upon exposure. Ethylenically unsaturated organic compounds are particularly useful. These compounds contain at least on terminal ethylene group per molecule. Typically, they are liquid and can double as a diluent oil for the internal phase. Ethylenically unsaturated compounds having two or more terminal ethylene groups per molecule are preferred. An example of this preferred subgroup is ethylenically unsatureated acid esters of polyhydric alcohols, such as trimethylol propane triacrylate (TMPTA).

Another group of substances useful as radiation sensitive compositions include isocyanate modified acrylic, methacrylic and itaconic acid esters of polyhydric alcohols as disclosed in U.S. Pat. Nos. 3,783,151; 3,759,809 and 3,825,479, all to Carlick et al. Radiation curable compositions including isocyanate modified esters and reactive diluents are commercially available as over print varnishes from Sun Chemical Corp., Carlstat, N.J., under the tradename of Sun Cure resins.

An example of negative working radiation depolymerizable materials that may be useful in the invention are 3-oximino-2-butanone methacrylate which undergoes main chain scission upon U.V. exposure and poly 4'-alkyl acylophenones. See Reichmanis, E.; Am. Chem. Soc. Div. Org. Coat. Plast. Chem. Prepr. 1980. 43, 243–251 and Lukac, I.; Chmela S., Int. Conf. on Modif. Polym. 5th. Bratislave, Czech. July 3–6, 1979, I.U.P-.A.C. Oxford, England 1979, 1, 176–182.

A photoinitiator is generally also required in the radiation sensitive composition. Numerous examples of suitable imaging initiators can be found in the literature. Examples of photoinitiators useful in the present invention include diaryl ketone derivatives, and benzoin alkyl ethers. Where ultraviolet sensitivity is desired, suitable photoinitiators include alkoxy phenyl ketones, 0-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes. In many cases it is advantageous to use a combination of imaging photoinitiators. For ultraviolet sensitivity one desirable combination is a combination of Michler's ketone and benzoin methyl ether (preferred ratio 2:5). Another useful combination is 2,2'-dimethoxy-2-phenylacetophenone, isopropylxanthone and ethyl paradimethylaminobenzoate. The later is preferably used with TMPTA to provide a radiation sensitive composition. See also commonly assigned U.S. application Ser. No. 800,014 filed Nov. 20, 1985.

The amount of photoinitiator in the radiation sensitive composition depends on the particular photosensitive material selected. It must be present in an amount sufficient to initiate polymerization or crosslinking within a short exposure time.

The radiation sensitive composition must make up a large enough proportion of the internal phase to effectively control the release of the image-forming agent following exposure. This generally means that the radiation sensitive material must constitute approximately 40 to 99% by weight of the internal phase of the capsules.

In the most typical case, color images are formed by image-wise releasing a color precursor from the capsules. In this case, in addition to the radiation sensitive composition, the internal phase usually includes the color precursor. Typical examples of color precursors useful in the present invention in providing photosensitive or pressure-sensitive systems include colorless electron donating type compounds. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem IV and XI (all products of Hilton-Davis Co.) are often used alone or in combination as color precursors in the present invention. Numerous other examples can be found in the carbonless paper art.

Color precursors represent only one type of image-forming agent which may be incorporated in or otherwise associated with the capsules of the present invention. Depending on the nature of the imaging material, other image-forming agents including colored dyes, pigments, metal salts and chelating agents may be incorporated into the capsules. The image-forming agent can be incorporated in a separate layer of the imaging sheet instead of in the capsules and activated by the release of the internal phase from the capsules. For example, the released internal phase may act as a solvent for an image-forming agent otherwise associated with the capsules.

Useful color developer materials for preparing the self-contained sheets of the present invention are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. These compounds are generally referred to as electron accepting type compounds.

Any ordinary coating or printing technique may be used to make the pressure-sensitive or photosensitive sheets of the present invention. The techniques described in U.S. Pat. No. 4,010,292 are useful.

The substrate upon which the capsules are coated may be paper (e.g., commercial impact raw stock, cast-coated paper, chrome-rolled paper, etc.) foil, or a plastic film (e.g., a PET film).

In addition to the radiation-sensitive composition and a color precursor, the internal phase may also include a diluent oil to adjust the tonal properties of the imaging sheet (i.e., the transfer sheet or the self-contained sheet). Representative examples of useful diluent oils are alkylated biphenyls (e.g., monoisopropyl-biphenyl), polychlorinated biphenyls, castor oils, dibutyl phthalate, dibutyl fumerate, brominated paraffin and mixtures thereof. Alkylated biphenyls are generally less toxic and preferred.

Imaging sheets incorporating the photosensitive capsules of the present invention are used by image-wise exposing them to actinic radiation and rupturing the capsules. As explained in the aforementioned commonly assigned patents, it is likely that images are formed by a combination of mechanisms whereby more capsules rupture in the exposed or unexposed areas depending upon whether the imaging material is a positive working or a negative working material, and the capsules which rupture release their contents in proportion to the degree of exposure. Reference may be made to U.S. Pat. No. 4,399,209 to Sanders et al for a discussion of imaging mechanics. The capsules are usually ruptured by pressure (e.g., by passing the exposed sheet through pressure rolls), but may also be ruptured by other means such as solvent vapor, ultrasound, abrasion, and the like.

The present invention is illustrated in more detail by the following non-limiting examples.

Example: Melamine-formaldehyde microcapsules were prepared as follows:

(1) 131.75 g of oily material to be the internal phase of the capsule is prepared and preheated to 60° C.

(2) The continuous phase for emulsification is prepared as follows and preheated to 60° C.:
353 g $H_2O$
7 g Versa TL-dissolved for 15 minutes or more
8 g Pectin-dry blended with sodium bicarbonate and dissolved into water phase
0.16 g $NaHCO_3$-dry blended with pectin and added concurrently
pH-adjusted by dropwise addition of acid and/or base to pH 6.0

(3) Emulsification as follows:
(a) external continuous phase containing Versa and Pectin brought to 3000 rpm mixing
(b) internal phase material (oil) added into mixing continuous phase containing Versa & Pectin
(c) 3000 rpm mixing maintained for 15 minutes after oil phase addition.

(4) Condensation reaction for capsule wall formation accomplished as follows:
(a) 151.1 g MF precondensate added to emulsion with mixing at 2000 rpm
(b) pH adjusted to pH 6.0
(c) Reaction mixture covered and held at 70° C. for 1 hour while mixing
(d) 46.2g Urea @ 50% solution added to reaction mixture and reaction allowed to continue at 70° C. for another hour. (This step scavenges unreacted formaldehyde.)
(e) The pH is adjusted to about 9.5 with NaOH (20% solution), covered and allowed to cool while mixing gently.

Microcapsules produced using the process just described possessed the following properties:
average size=4.89 um
sigma of size distribution=2.0 um

COMPARATIVE EXAMPLE

For direct comparison of the Versa/Pectin system with an Isobam/Pectin system the following capsules were made by the procedure described in Example 1.

| Isobam/Pectin | Versa/Pectin |
|---|---|
| 68 g oil phase | 68 g oil phase |
| 110 g H₂O | 110 g H₂O |
| 4.6 g Isobam (dry wt.) | 2.3 g Versa TL |
| 4 g Pectin | 4 g Pectin |
| 108.8 g MF precondensate | 108.8 g MF precondensate |
| 15.4 g Urea - 50% Solution | 15.4 g Urea - 50% solution |

The properties of the resultant capsules were as follows:

| Isobam/Pectin Capsules | Versa/Pectin Capsules |
|---|---|
| average size = 12.0 um | average size = 3.7 um |
| 95% <18.0 um | 95% <8.4 um |

Having described the invention in detail and by reference to specific embodiments thereof, it will be apparent that numerous modifications and variations are possible without departing from the scope of the invention defined by the following claims.

What is claimed is:

1. A process for forming microcapsules having discrete capsule walls comprising the steps of forming an emulsion of an oily core material in a continuous aqueous phase containing methylated polygalacturonic acid and sulfonated polystyrene and enwrapping particles of said oily core material in an amine-formaldehyde condensation product produced by in situ condensation of an amine and formaldehyde.

2. The process of claim 1 wherein said amine is urea or melamine.

3. The process of claim 2 wherein said polygalacturonic acid is pectin.

4. The process of claim 3 wherein said formaldehyde condensation product is a melamine-formaldehyde resin.

5. The process of claim 3 wherein said formaldehyde condensation product is a urea-formaldehyde resin.

6. The process of claim 3 wherein said pectin exhibits a methylation degree of about 40 to 70%.

7. The process of claim 1 wherein said sulfonated polystyrene is characterized by a sulfonation degree greater than 85%.

8. The process of claim 7 wherein the sulfonation degree of said polystyrene is greater than 95%.

9. The process of claim 4 wherein said pectin exhibits a methylation degree of about 40 to 70%.

10. The process of claim 7 wherein said sulfonated polystyrene exhibits a sulfonation degree greater than 85%.

11. The process of claim 8 wherein said sulfonated polystyrene has a molecular weight greater than 100,000.

12. The process of claim 11 wherein said sulfonated polystyrene has a molecular weight greater than 500,000.

13. The process of claim 12 wherein said sulfonated polystyrene has a sulfonation degree greater than 95%.

14. The process of claim 1 wherein said core material is a photopolymerizable composition.

15. The process of claim 14 wherein said photopolymerizable composition contains an ethylenically unsaturated compound.

* * * * *